United States Patent
Lin et al.

(10) Patent No.: US 9,065,028 B2
(45) Date of Patent: Jun. 23, 2015

(54) FLIP-CHIP LIGHT EMITTING DIODE PACKAGE WITH MOISTURE BARRIER LAYER

(71) Applicant: ADVANCED OPTOELECTRONIC TECHNOLOGY, INC., Hsinchu Hsien (TW)

(72) Inventors: Hou-Te Lin, Hsinchu (TW); Chao-Hsiung Chang, Hsinchu (TW); Pin-Chuan Chen, Hsinchu (TW); Lung-Hsin Chen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/096,031

(22) Filed: Dec. 4, 2013

(65) Prior Publication Data

US 2014/0291713 A1 Oct. 2, 2014

(30) Foreign Application Priority Data

Apr. 2, 2013 (CN) .......................... 2013 1 01113089

(51) Int. Cl.
| | |
|---|---|
| *H01L 33/00* | (2010.01) |
| *H01L 33/54* | (2010.01) |
| *H01L 33/60* | (2010.01) |
| *H01L 33/44* | (2010.01) |
| *H01L 33/48* | (2010.01) |
| *H01L 33/62* | (2010.01) |

(52) U.S. Cl.
CPC ................ *H01L 33/60* (2013.01); *H01L 33/44* (2013.01); *H01L 33/486* (2013.01); *H01L 33/62* (2013.01); *H01L 2924/0002* (2013.01); *H01L 2224/13* (2013.01)

(58) Field of Classification Search
CPC .......... H01L 33/60; H01L 33/38; H01L 33/54
USPC ....... 257/98–100, 666–796, E33.066; 438/26
See application file for complete search history.

(56) References Cited

U.S. PATENT DOCUMENTS

| | | | |
|---|---|---|---|
| 2007/0158674 A1* | 7/2007 | Taguchi et al. | 257/99 |
| 2008/0191227 A1* | 8/2008 | Kimura et al. | 257/98 |
| 2013/0001633 A1* | 1/2013 | Imai et al. | 257/99 |

FOREIGN PATENT DOCUMENTS

TW  201225344 A1  6/2012

* cited by examiner

*Primary Examiner* — Selim Ahmed
*Assistant Examiner* — Changhyun Yi
(74) *Attorney, Agent, or Firm* — Novak Druce Connolly Bove + Quigg LLP

(57) ABSTRACT

An exemplary light emitting diode (LED) package includes a substrate, a first electrode penetrating downward through the substrate, a second electrode penetrating downward through the substrate and spaced from the first electrode, an LED die arranged on the substrate and mounted to the first and second electrodes by flip-chip technology, and an encapsulation layer formed on the substrate to encapsulate the LED die therein. The substrate includes a top surface and a bottom surface at opposite sides thereof. Top ends of the first and second electrodes are exposed at the top surface of the substrate, and bottom ends of the first and second electrodes are exposed at the bottom surface of the substrate. A moisture barrier layer is attached on the bottom of the LED package to cover a joint of the first and/or second electrode and the substrate.

18 Claims, 5 Drawing Sheets

FLIP-CHIP LIGHT EMITTING DIODE PACKAGE WITH MOISTURE BARRIER LAYER

TECHNICAL FIELD

The present disclosure relates generally to a light emitting diode (LED) package with a moisture barrier layer formed on a bottom thereof, wherein the LED package has an LED die which is mounted to electrodes of the LED package by flip-chip technology.

DESCRIPTION OF RELATED ART

LEDs are solid state light emitting devices formed of semiconductors. LEDs are more stable and reliable than other conventional light sources such as incandescent bulbs. Thus, LEDs are being widely used in various fields such as numeral/character displaying elements, signal lights, and lighting and display devices.

An LED package usually includes a substrate, a first electrode formed on the substrate, a second electrode formed on the substrate and spaced from the first electrode by a spacer, and an LED die mounted on the substrate and electrically connected to the first and second electrodes by wires. The spacer has a central protrusion above the first and second electrodes, thereby to hinder a connection of the LED die to the electrodes by flip-chip technology. In order to prolong a life-span of the LED package, it is common to form an encapsulation layer on the substrate to encapsulate the LED die mounted on the substrate, whereby the LED die inside of the LED package is isolated from ambient air.

However, moisture may still easily permeate into the inside of the LED package through the substrate-electrode interface, due to weak bonding between the electrode(s) and the substrate. Permeation is particularly common when the substrate is made of material such as silicon resin or epoxy resin, whereby a contact area between the electrode(s) and the LED die inside of the LED package is prone to oxidation by the moisture. That is, such kind of the LED package has low oxidation resistance. Furthermore, when there is oxidation, it is difficult for heat generated by the LED die to be dissipated. Buildup of the heat may greatly accelerate deterioration and degradation of the LED package.

What is needed, therefore, is an improved LED package which can overcome the above mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
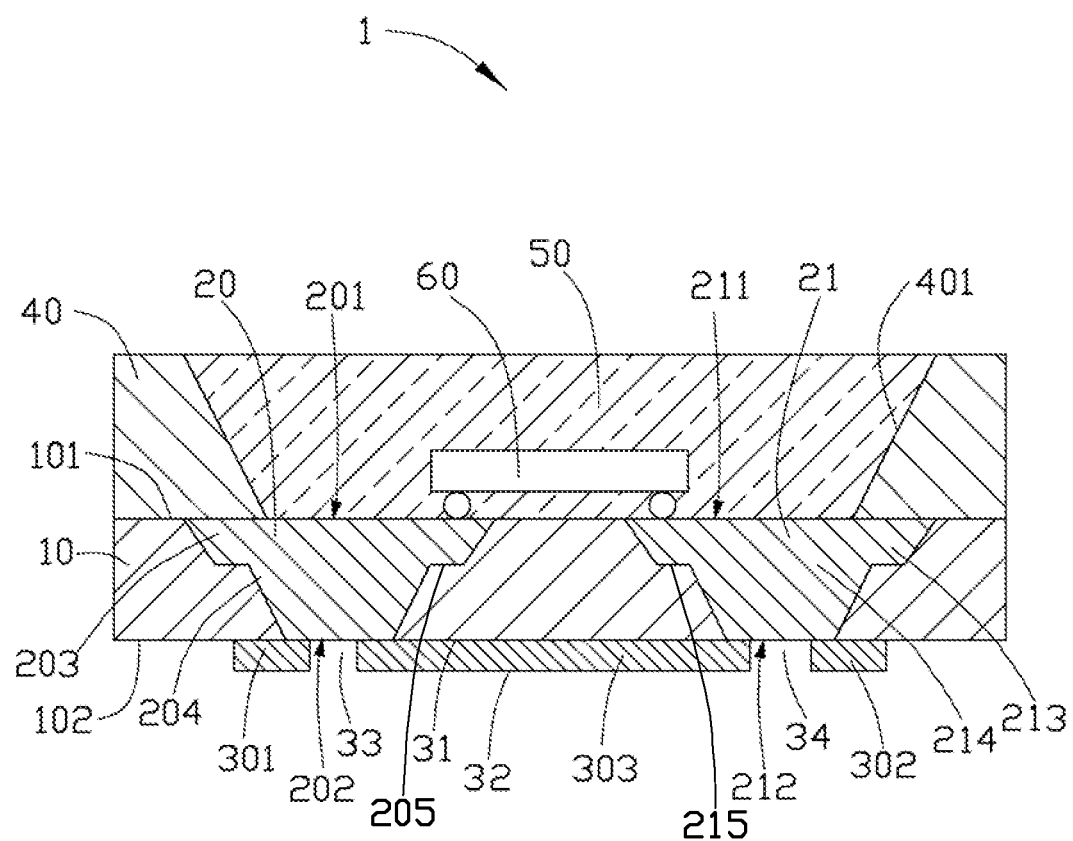
FIG. 1 is a schematic, cross-sectional view of a light emitting diode (LED) package in accordance with a first embodiment of the present disclosure.
Figure 2:
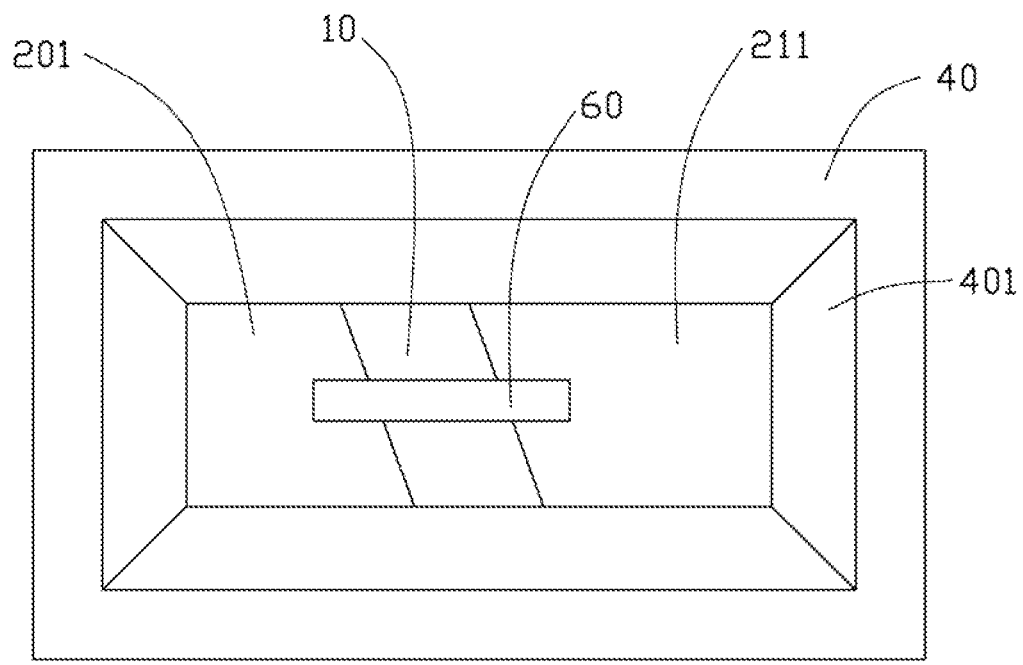
FIG. 2 is a top plan view of the LED package of FIG. 1, with an encapsulation layer omitted for clarity.
Figure 3:
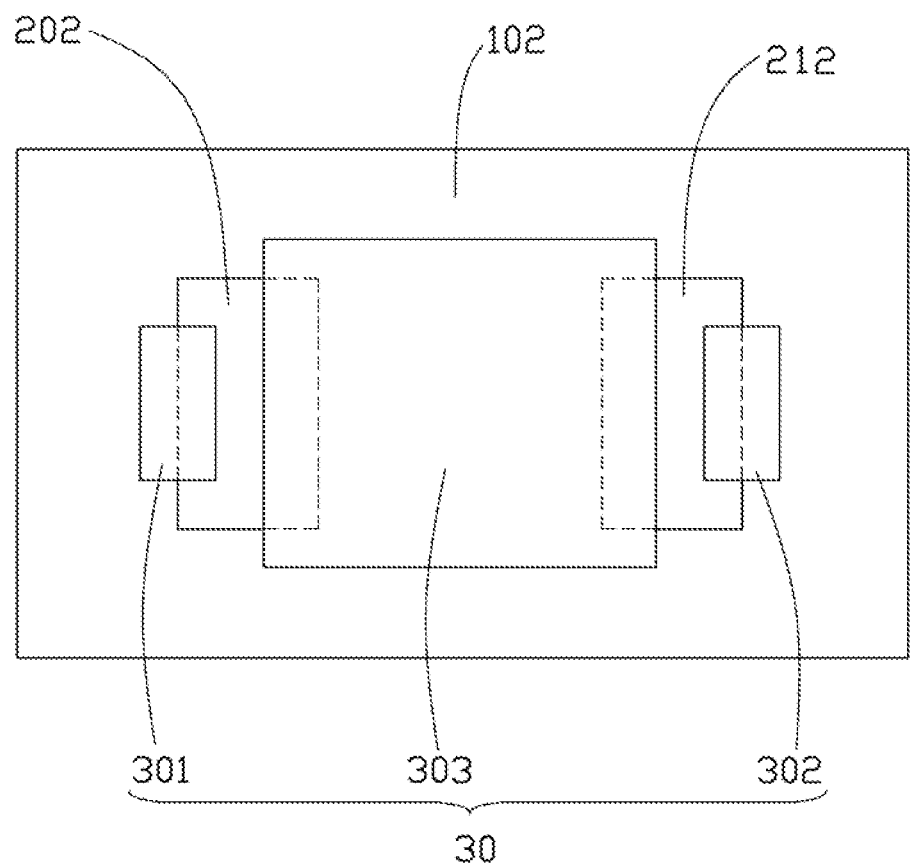
FIG. 3 is a bottom plan view of the LED package of FIG. 1.

Referring to FIGS. 1, 2 and 3, a light emitting diode (LED) package 1 in accordance with a first embodiment of the present disclosure includes a substrate 10, a first electrode 20 embedded in the substrate 10, a second electrode 21 embedded in the substrate 10 and spaced from the first electrode 20, an LED die 60 mounted on the substrate 10 and electrically connected to the first and second electrodes 20, 21 by flip-chip technology, a reflective cup 40 formed on the substrate 10 and surrounding the LED die 60, and an encapsulation layer 50 formed on the substrate 10, enclosed by the reflective cup 40 and encapsulating the LED die 60. The LED package 1 further includes a moisture barrier layer 30 (as shown in FIG. 3) attached on the bottom thereof to cover a part of joints of the first and second electrodes 20, 21 and the substrate 10.

The substrate 10 includes a top surface 101 and a bottom surface 102 at opposite sides thereof. In the present embodiment, the substrate 10 is rectangular, and both the top and bottom surfaces 101, 102 of the substrate 10 are horizontal surfaces which are in parallel with each other. The substrate 10 is a highly heat conductive and electrically insulated substrate, which is made of a material such as ceramic. The first and second electrodes 20, 21 are spaced from each other by a central part of the substrate 10. Thus, the first and second electrodes 20, 21 are electrically insulated from each other. The top surface 101 of the substrate 10 at the central part thereof is coplanar with top faces 201, 211 of the first and second electrodes 20, 21, whereby the LED die 60 can be mounted to the first and second electrodes 20, 21 by flip-chip technology as shown in FIG. 1 of the present disclosure.

The first and second electrodes 20, 21 respectively penetrate downwardly through the substrate 10 from the top surface 101 to the bottom surface 102. The first electrode 20 includes the top face 201 and a bottom face 202 at opposite sides thereof. The second electrode 21 includes the top face 211 and a bottom face 212 at opposite sides thereof. The top faces 201, 211 of the first and second electrodes 20, 21 are exposed at the top surface 101 of the substrate 10. The bottom faces 202, 212 of the first and second electrodes 20, 21 are exposed at the bottom surface 102 of the substrate 10.

In the present embodiment, the top faces 201, 211 of the first and second electrodes 20, 21 are coplanar with the top surface 101 of the substrate 10, and the bottom faces 202, 212 of the first and second electrodes 20, 21 are coplanar with the bottom surface 102 of the substrate 10. Alternatively, a top end of each of the first and second electrodes 20, 21 can protrude upwardly from the top surface 101 of the substrate 10 by a short distance, and a bottom end of each of the first and second electrodes 20, 21 can protrude downwardly from the bottom surface 102 of the substrate 10 by a short distance.

The first electrode 20 includes an elongated first head portion 203 and a tapered first branch portion 204 extending downward from a central region of a bottom of the first head portion 203. Similarly, the second electrode 21 includes an elongated second head portion 213 and a tapered second branch portion 214 extending downward from a central region of a bottom of the second head portion 213. Each of the first and second electrodes 20, 21 has a transverse cross section with a shape of a generally truncated wedge. A transverse cross section width of the first electrode 20 gradually decreases along a thickness direction thereof from the top face 201 towards the bottom face 202 (i.e. a direction from top to bottom in FIG. 1). Similarly, a transverse cross section width of the second electrode 21 gradually decreases along a thickness direction thereof from the top face 211 towards the bottom face 212. A first step 205 is formed between the first head portion 203 and the tapered first branch portion 204 of the first electrode 20; similarly, a second step 215 is formed between the second head portion 213 and the tapered second branch portion 214 of the second electrode 21. The first and second steps 205, 215 are provided for increasing an engagement between the first and second electrodes 20, 21 and the substrate 10.

In the present embodiment, both the first and second head portions 203, 213 of the first and second electrodes 20, 21 are an inverted pyramid frustum, and both the first and second branch portions 204, 214 of the first and second electrodes 20, 21 are an inverted cone frustum.

The reflective cup 40 defines a receiving cavity 401 therein. The LED die 60 is received in the receiving cavity 301 and surrounded by the reflective cup 40. A lateral outer periphery of the reflective cup 40 is aligned with a lateral periphery of the substrate 10. In the present embodiment, the reflective cup 40 and the substrate 10 are separately molded, and then combined together into one integrated piece via gluing. Alternatively, the reflective cup 40 and the substrate 10 could be integrally formed as a monolithic piece by injection molding. It is preferred that the reflective cup 40 is made of a material the same as the substrate 10, such as ceramic.

The top face 201 of the first electrode 20 and the top face 211 of the second electrode 21 each are rectangular. A majority of the top face 201 of the first electrode 20 is exposed at a bottom of the receiving cavity 401 of the reflective cup 40, with a left-side portion of the top face 201 being covered by the reflective cup 40. A majority of the top face 211 of the second electrode 21 is exposed at the bottom of the receiving cavity 401 of the reflective cup 40, with a right-side portion of the top face 211 being covered by the reflective cup 40. That is, a short side of the top face 201 of the first electrode 20 away from the second electrode 21 and a short side of the top face 211 of the second electrode 21 away from the first electrode 20 each are covered by the reflective cup 40.

The encapsulation layer 50 is formed in the receiving cavity 401 of the reflective cup 40 and encapsulates the LED die 60 therein. The encapsulation layer 50 completely fills the receiving cavity 401. It is preferred that the encapsulation layer 50 contains phosphor particles distributed therein to convert a wavelength range of light rays emitted from the LED die 60 to a desired wavelength range and scatter the light rays.

The moisture barrier layer 30 includes a top face 31 and a bottom face 32 at opposite sides thereof. The exposed bottom faces 202, 212 of the first and second electrodes 20, 21 are spaced from the bottom face 32 of the moisture barrier layer 30 by a short distance (as shown in FIG. 1), i.e., a thickness of the moisture barrier layer 30.

The moisture barrier layer 30 includes a first portion 301 covering a part of an outer joint of the first electrode 20 and the substrate 10, a second portion 302 covering a part of an outer joint of the second electrode 21 and the substrate 10, and a third portion 303 covering a part of inner joints of the first and second electrode 20, 21 and the substrate 10. The first, second and third portions 301, 302 and 303 of the moisture barrier layer 30 are separated from each other.

The first and third portions 301, 303 of the moisture barrier layer 30 cooperatively define a first gap 33 (as shown in FIG. 1) therebetween. The second and third portions 302, 303 of the moisture barrier layer 30 cooperatively define a second gap 34 (as shown in FIG. 1) therebetween. The first and second gaps 33, 34 are adapted for accommodating soldering slugs (not shown) therein which are made of tin alloy. The first and second electrodes 20, 21 are electrically connected to external circuitry such as printed circuit board (PCB) via the soldering slugs, respectively.

Figure 4:
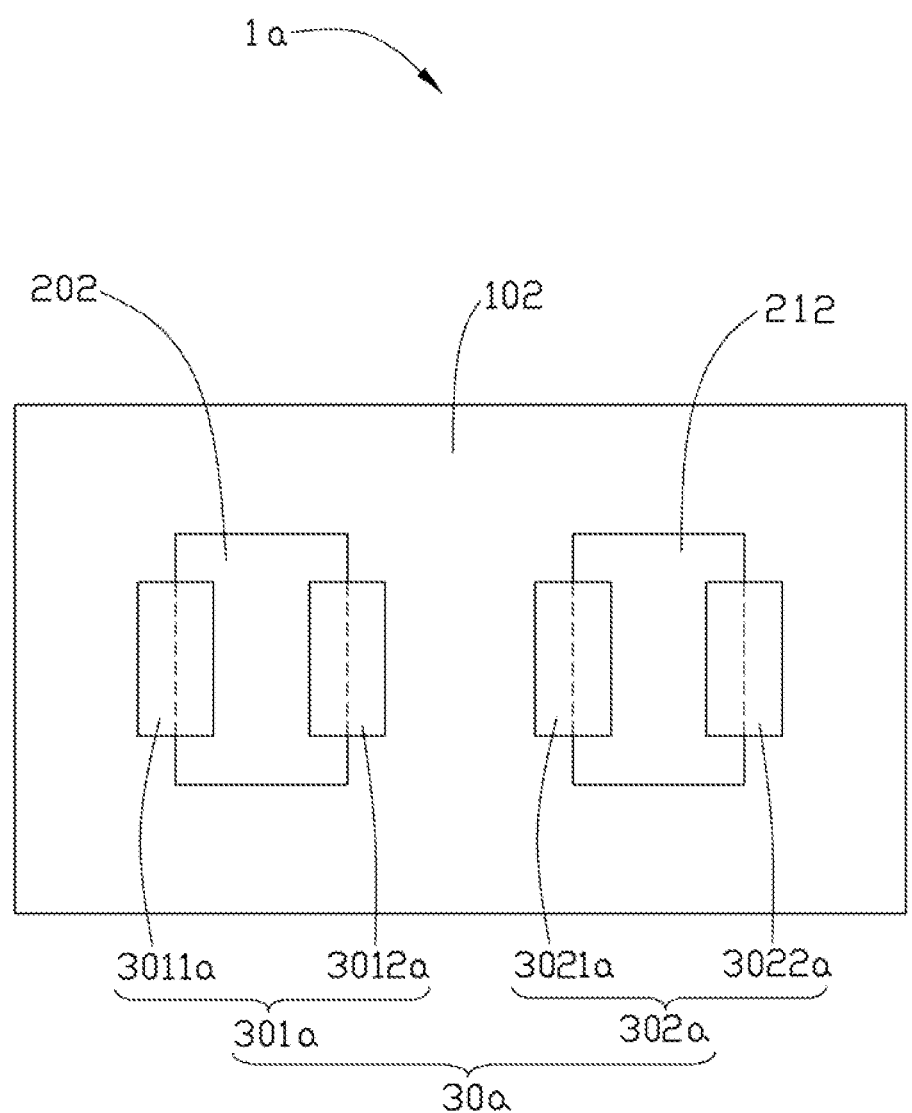
FIG. 4 is a schematic, bottom plan view of a light emitting diode (LED) package in accordance with a second embodiment of the present disclosure.

Referring to FIG. 4, a light emitting diode (LED) package 1a in accordance with a second embodiment of the present disclosure is illustrated. Different from the LED package 1 as shown in FIG. 3, in the LED package 1a, the first portion 301a of the moisture barrier layer 30a includes a first barrier segment 3011a and a second barrier segment 3012a separated from the first barrier segment 3011a. Similarly, the second portion 302a of the moisture barrier layer 30a includes a third barrier segment 3021a and a fourth barrier segment 3022a separated from the third barrier segment 3021a. The second barrier segment 3012a of the first portion 301a is adjacent to the third barrier segment 3021a of the second portion 302a of the moisture barrier layer 30a.

Figure 5:
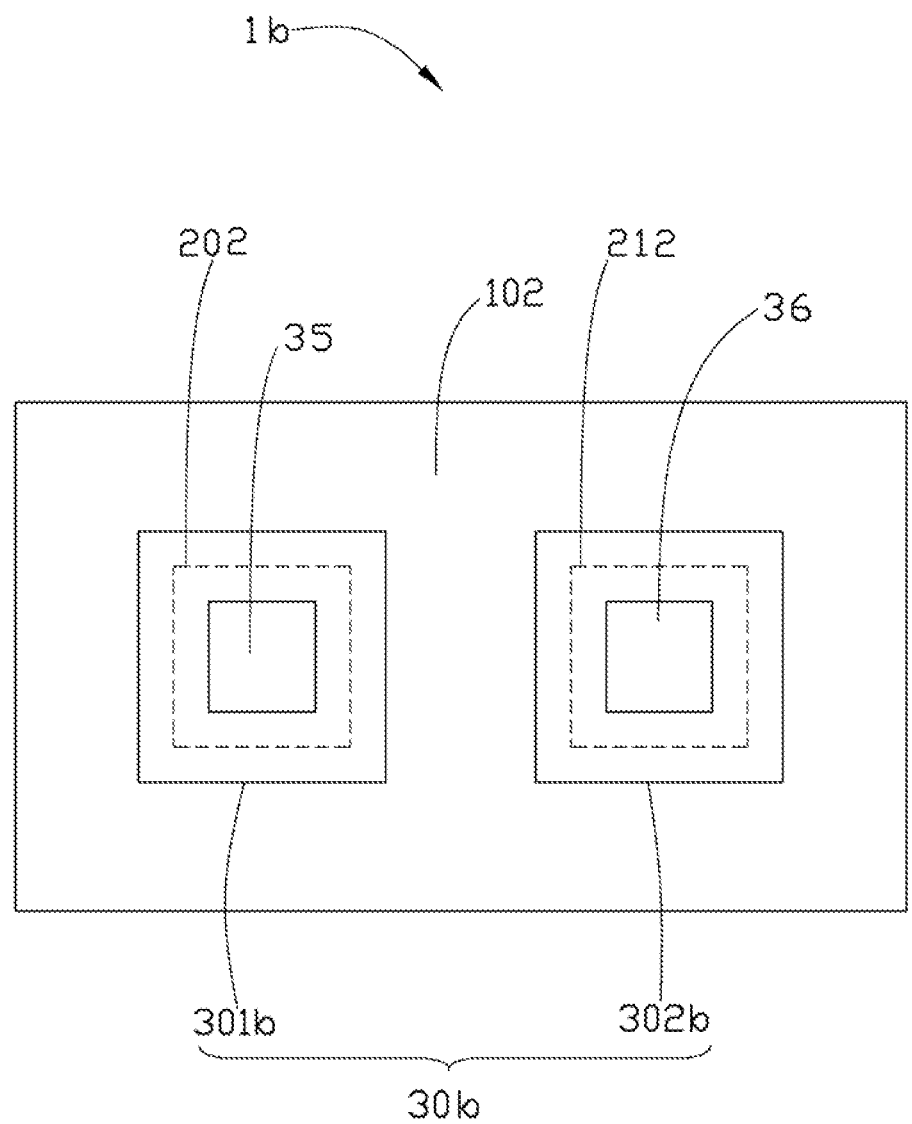
FIG. 5 is a schematic, bottom plan view of a light emitting diode (LED) package in accordance with a third embodiment of the present disclosure.

Referring to FIG. 5, a light emitting diode (LED) package 1b in accordance with a third embodiment of the present disclosure is illustrated. Different from the LED package 1 as shown in FIG. 3, in the LED package 1b, the first portion 301b of the moisture barrier layer 30b extends along the periphery of the exposed bottom face 202 of the first electrode 20 and completely covers the joint of the first electrode 20 and the substrate 10. Similarly, the second portion 302b of the moisture barrier layer 30b extends along the periphery of the exposed bottom face 212 of the second electrode 21 and completely covers the joint of the second electrode 21 and the substrate 10. The first portion 301b of the moisture barrier layer 30b defines a first opening 35 to accommodate the soldering slug therein. The second portion 302b of the moisture barrier layer 30b defines a second opening 36 to accommodate the soldering slug therein.

In the present disclosure, the moisture barrier layer 30, 30a, 30b is attached on the bottom of the LED package 1, 1a, 1b to cover a joint(s) of the first and/or second electrode 20, 21 and the substrate 10. Accordingly, a path along which moisture might enter a joint(s) of the first and/or second electrodes 20, 21 and the substrate 10 is reduced by the moisture barrier layer 30, 30a, 30b. Thereby, deterioration of the LED package 1 due to infiltration of moisture into the joint(s) is effectively delayed. That is, the LED package 1, 1a, 1b has high oxidation resistance, and a rate of deterioration of the LED package 1 is reduced.

Furthermore, the bottom faces 202, 212 of the first and second electrodes 20, 21 are exposed at the bottom surface 102 of the substrate 10. Therefore heat generated by the LED die 60 is effectively dissipated outside the package through the bottom faces 202, 212. In addition, the exposed bottom faces 202, 212 is spaced from the bottom face 32 of the moisture barrier layer 30, 30a, 30b, thus the possibility of overflow of the soldering slugs to contaminate each other to cause a short-circuit can be greatly reduced.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments.

What is claimed is:
1. A light emitting diode (LED) package comprising:
 a substrate comprising a top surface and a bottom surface at opposite sides thereof;
 a first electrode and a second electrode spaced from the first electrode, the first and second electrodes respectively penetrating downwardly through the substrate from the top surface to the bottom surface, top ends of the first and second electrodes being exposed at the top surface of the substrate, and bottom ends of the first and second electrodes being exposed at the bottom surface of the substrate;

an LED die mounted on the top surface of the substrate and being electrically connected to the first and second electrodes by flip-chip technology;

an encapsulation layer formed on the top surface of the substrate to encapsulate the LED die therein; and a moisture barrier layer attached on the bottom thereof to cover at least a part of a joint of the first electrode and/or the second electrode and the substrate;

wherein each of the first and second electrodes has a top face and a bottom face at opposite sides thereof, the top faces of the first and second electrodes being exposed at the top surface of the substrate, the bottom faces of the first and second electrodes being exposed at the bottom surface of the substrate, and the top faces of the first and second electrodes being coplanar with the top surface of the substrate; and wherein each of the first and second electrodes comprises an elongated head portion and a tapered branch portion extending downwardly from a central region of the bottom of the head portion, and a first step formed between the elongated head portion and the tapered branch portion of the first electrode and a second step formed between the elongated head portion and the tapered branch portion of the second electrode are respectively embedded in the substrate.

2. The LED package of claim 1, wherein the moisture barrier layer comprises a first portion attached on the bottom of the LED package to cover at least a part of the joint of the first electrode and the substrate.

3. The LED package of claim 2, wherein the first portion of the moisture barrier layer completely covers the joint of the first electrode and the substrate.

4. The LED package of claim 2, wherein the moisture barrier layer further comprises a second portion attached on the bottom of the LED package to cover at least a part of the joint of the second electrode and the substrate.

5. The LED package of claim 4, wherein the second portion of the moisture barrier layer completely covers the joint of the second electrode and the substrate.

6. The LED package of claim 4, wherein the first portion of the moisture barrier layer comprises a first barrier segment and a second barrier segment separated from the first barrier segment.

7. The LED package of claim 6, wherein the second portion of the moisture barrier layer comprises a third barrier segment and a fourth barrier segment separated from the third barrier segment.

8. The LED package of claim 7, wherein the second barrier segment of the first portion is adjacent to the third barrier segment of the second portion of the moisture barrier layer.

9. The LED package of claim 7, wherein the second barrier segment of the first portion and the third barrier segment of the second portion of the moisture barrier layer are joined together.

10. The LED package of claim 1, wherein the bottom faces of the first and second electrodes are coplanar with the bottom surface of the substrate.

11. The LED package of claim 10, wherein the moisture barrier layer extends along a periphery of the exposed bottom face of the first and/or second electrode.

12. The LED package of claim 11, wherein the moisture barrier layer comprises a top face attached to the bottom surface of the substrate and a bottom face at opposite sides thereof, and the exposed bottom faces of the first and second electrode are spaced from the bottom face of the moisture barrier layer by a distance which is a thickness of the moisture barrier.

13. The LED package of claim 1, further comprising a reflective cup provided on the top surface of the substrate, and the reflective cup defines a receiving cavity, the LED die being received in the receiving cavity and surrounded by the reflective cup, the encapsulation layer being received in the receiving cavity and encapsulating the LED die therein.

14. The LED package of claim 13, wherein the top face of each of the first and second electrodes is rectangular, and a majority of the top face of each of the first and second electrodes is exposed at the bottom of the receiving cavity, with a side portion of the top face of each of the first and second electrodes directly contacting and being covered by the reflective cup.

15. The LED package of claim 13, wherein the substrate is rectangular, and a lateral outer periphery of the reflective cup is aligned with a lateral periphery of the substrate.

16. The LED package of claim 1, wherein each of the first and second electrodes has a transverse cross section with a shape of a truncated wedge.

17. The LED package of claim 16, wherein each of the first and second electrodes has a transverse cross section width that gradually decreases as it extends towards the bottom of the LED package along a thickness direction thereof.

18. The LED package of claim 4, wherein the moisture barrier layer further comprises a third portion attached on the bottom of the LED package to cover a part of inner joints of the first and second electrode and the substrate.

* * * * *